United States Patent
Skifton et al.

(10) Patent No.: US 11,555,747 B2
(45) Date of Patent: Jan. 17, 2023

(54) MULTI-CORE HIGH-TEMPERATURE, IRRADIATION-RESISTANT THERMOCOUPLE, AND RELATED METHODS

(71) Applicant: Battelle Energy Alliance, LLC, Idaho Falls, ID (US)

(72) Inventors: Richard S. Skifton, Idaho Falls, ID (US); Joshua Daw, Idaho Falls, ID (US); Douglas A. Corbett, Rigby, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 18 days.

(21) Appl. No.: 16/946,657

(22) Filed: Jun. 30, 2020

(65) Prior Publication Data

US 2021/0404884 A1 Dec. 30, 2021

(51) Int. Cl.
| | |
|---|---|
| *G01K 7/00* | (2006.01) |
| *G01K 7/02* | (2021.01) |
| *G01K 7/04* | (2006.01) |
| *G01K 1/08* | (2021.01) |
| *H01L 35/04* | (2006.01) |
| *H01L 35/12* | (2006.01) |
| *H01L 35/32* | (2006.01) |
| *H01L 35/34* | (2006.01) |

(52) U.S. Cl.
CPC ............ *G01K 7/021* (2013.01); *G01K 1/08* (2013.01); *G01K 7/023* (2013.01); *G01K 7/04* (2013.01); *H01L 35/04* (2013.01); *H01L 35/12* (2013.01); *H01L 35/32* (2013.01); *H01L 35/34* (2013.01)

(58) Field of Classification Search
CPC combination set(s) only.
See application file for complete search history.

(56) References Cited

U.S. PATENT DOCUMENTS

| | | | |
|---|---|---|---|
| 4,075,036 A | 2/1978 | Lysikov et al. | |
| 4,186,605 A | 2/1980 | Bourigault | |
| 7,611,280 B2 * | 11/2009 | Habboosh | C22C 5/04 136/200 |
| 8,961,007 B2 | 2/2015 | Subramanian et al. | |
| 2003/0016730 A1 | 1/2003 | Daily et al. | |

(Continued)

FOREIGN PATENT DOCUMENTS

| | | | | |
|---|---|---|---|---|
| CN | 1480717 A | | 3/2004 | |
| DE | 102008007740 | * | 7/2009 | ............ G01K 13/02 |
| WO | WO-2019042529 A1 | * | 3/2019 | ............... G01K 1/08 |

*Primary Examiner* — Lisa M Caputo
*Assistant Examiner* — Nasir U. Ahmed
(74) *Attorney, Agent, or Firm* — TraskBritt (57) ABSTRACT

A multi-core thermocouple includes a plurality of wires, an insulation core surrounding the plurality of wires, a sheath surrounding the insulation core, and a plurality of electrical junctions. The plurality of electrical junctions may include a first electrical junction formed between a first wire of the plurality of wires and the sheath at a first axial mid-section of the multi-core thermocouple, the first electrical junction including a first swaged axial mid-section of the sheath and a second electrical junction formed between a second wire of the plurality of wires and the sheath at a second, different axial mid-section of the multi-core thermocouple, the second electrical junction including a second swaged axial mid-section of the sheath.

20 Claims, 7 Drawing Sheets

(56) References Cited

U.S. PATENT DOCUMENTS

| | | | |
|---|---|---|---|
| 2008/0205483 A1* | 8/2008 | Rempe | G01K 7/02 374/E7.004 |
| 2019/0049314 A1* | 2/2019 | Chu | G01K 13/00 |
| 2020/0194652 A1* | 6/2020 | Skifton | G01R 19/03 |

* cited by examiner

MULTI-CORE HIGH-TEMPERATURE, IRRADIATION-RESISTANT THERMOCOUPLE, AND RELATED METHODS

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

TECHNICAL FIELD

This disclosure relates generally to thermocouples for measuring temperatures in high temperature, radioactive environments (e.g., nuclear reactors). In particular, the disclosure further relates to methods of forming and using multi-core thermocouples.

BACKGROUND

Approximation of nuclear reactor temperature is conventionally performed using thermocouples by placing the thermocouples relatively far away from a point of interest and through interpolation and/or extrapolation of two or more thermocouples, an approximation of the temperature can be inferred. In particular, the thermocouples may be placed relatively far from the point of interest (e.g., a reactor vessel) in order to reduce an "observer effect." The foregoing approach often leads to costly mistakes, over redundancy of the experiments, and overly conservative safety margins in power reactors. The costly mistakes, over redundancy, and overly conservative safety margins result in exorbitant additional costs to operating the reactors. Additionally, conventional high temperature thermocouples quickly de-calibrate (drift) when exposed to neutron radiation. Moreover, it often proves difficult to measure live temperature profiles of reactor fuel pins when using conventional high temperature thermocouples.

SUMMARY

Some embodiments of the present disclosure include a multi-core thermocouple. The multi-core thermocouple may include a plurality of wires, an insulation core surrounding the plurality of wires, a sheath surrounding the insulation core, and a plurality of electrical junctions. The plurality of electrical junctions may include a first electrical junction formed between a first wire of the plurality of wires and the sheath at a first axial mid-section of the multi-core thermocouple, the first electrical junction including a first swaged axial mid-section of the sheath and a second electrical junction formed between a second wire of the plurality of wires and the sheath at a second, different axial mid-section of the multi-core thermocouple, the second electrical junction including a second swaged axial mid-section of the sheath.

Additional embodiments of the present disclosure include a multi-core thermocouple. The multi-core thermocouple may include a first wire comprising a first material, a second wire comprising the first material, an insulation core surrounding both the first wire and the second wire, a sheath surrounding the insulation core, the sheath including at least a second material, a first electrical junction formed between the first wire and the sheath at a first axial position along a longitudinal axis of the sheath, and a second electrical junction formed between the second wire and the sheath at a second, different axial position along the longitudinal axis of the sheath, wherein the first material comprises one of molybdenum (Mo) or niobium (Nb) and the second material comprises the other of molybdenum (Mo) or niobium (Nb).

Further embodiments of the present disclosure include a method of forming a multi-core thermocouple. The method may include forming a plurality of first elements, forming an insulation core, disposing the plurality of first element within the insulation core, folding a longitudinal end of at least one first element of the plurality of first elements back upon itself to form a folded end, forming a second common element around the insulation core, and forming an electrical junction between each first element of the plurality of first elements and the second common element.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein.

DETAILED DESCRIPTION

The illustrations presented herein are not actual views of any thermocouple, coaxial thermocouple, or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," etc., is used for clarity and convenience in understanding the disclosure and accompanying drawings, and does not connote or depend on any specific preference or order, except where the context clearly indicates otherwise.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

Embodiments of the present disclosure include multi-core thermocouple having a plurality of wires grounded to a common outer sheath, each forming a respective thermocouple. The thermocouples of the multi-core thermocouple may each form a high temperature, irradiation-resistant thermocouple that enables radiation hardened temperature probes to be more compactly positioned within reactors during temperature measurements. The multi-core thermocouple of the present disclosure may provide multiple temperature readings in a single compact probe. For instance, the multi-core thermocouple may include five or more thermocouples within a probe having an outer diameter of about 1.6 mm. As is discussed in greater detail below, the multi-core thermocouples of the present disclosure have shown to withstand both the high temperatures (e.g., up to 1800° C.) and high radiation (e.g., neutron) of nuclear reactor fuel design tests and/or over-temperature accident conditions. The multi-core thermocouples of the present disclosure may exhibit relatively fast response times and may continue to operate when conventional thermocouples would drift and/or be rendered inoperable due to neutron exposure. Moreover, by sharing a common outer sheath as an element, the multi-core thermocouple of the present disclosure reduces an uncertainty of temperature fields by directly measuring temperature differences along a longitudinal length of the multi-core thermocouple.

Figure 1A:
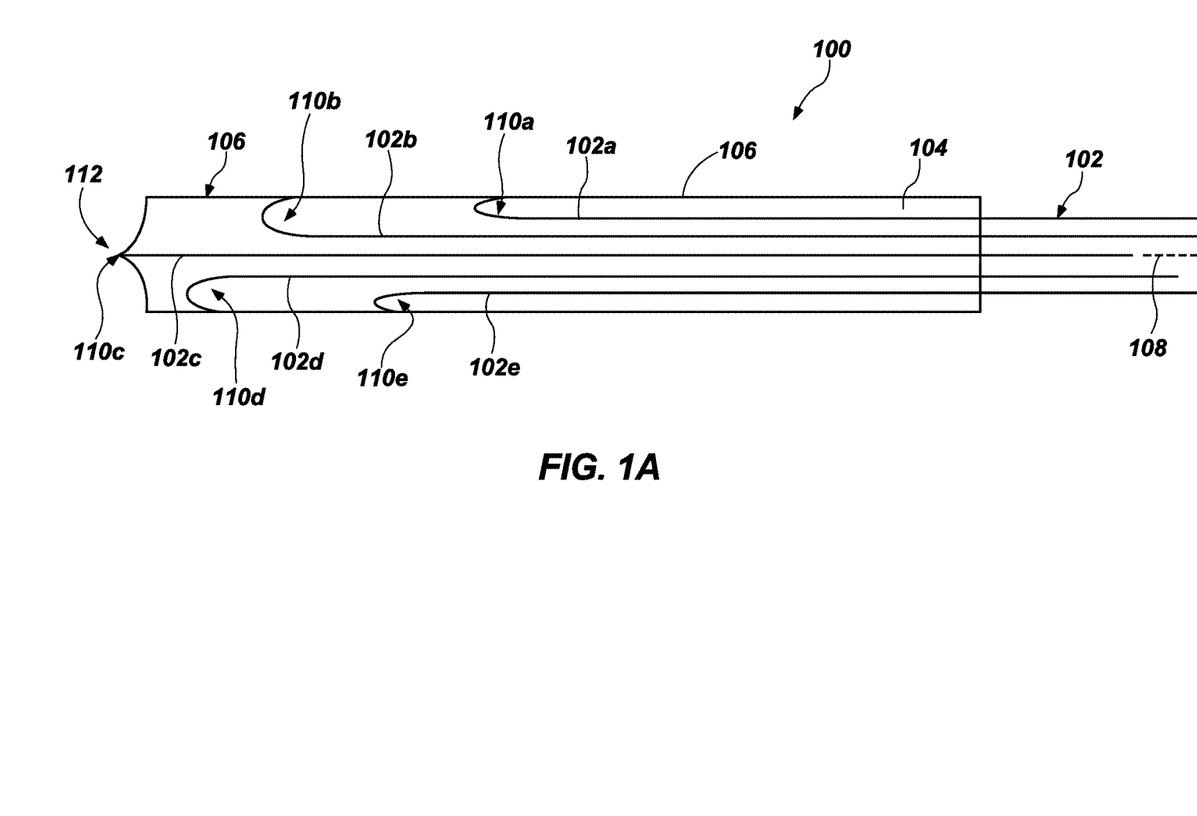
FIG. 1A illustrates a schematic diagram of a multi-core thermocouple in accordance with one or more embodiments of the present disclosure.
Figure 1B:
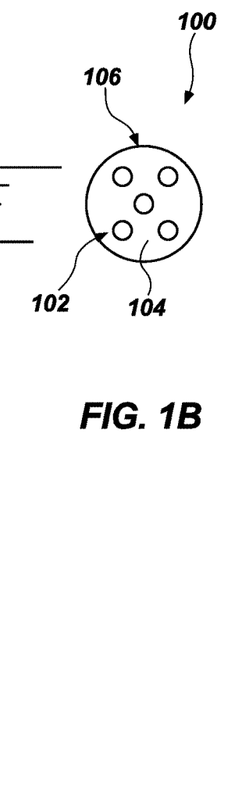
FIG. 1B illustrates a schematic side cross-section view of a multi-core thermocouple in accordance with one or more additional embodiments of the present disclosure.

FIG. 1A shows a schematic internal view of a multi-core thermocouple 100 according to one or more embodiments of the present disclosure. The multi-core thermocouple 100 may also be referred to as a multi-core demicouple. For example, as used herein, the term demicouple may refer to a thermocouple that includes only a single wire element having a junction with another element (e.g., a sheath) that is common to more than one demicouple. FIG. 1B is a schematic cross-sectional view of the multi-core thermocouple 100 of FIG. 1A that is perpendicular to the view of FIG. 1A.

In some embodiments, the multi-core thermocouple 100 may include a plurality of wires 102a, 102b, 102c, 102d, 102e (referred to herein collectively with the reference numeral "102") (e.g., first elements), an insulation core 104, and a sheath 106 (e.g., a second common element). The plurality of wires 102 may be disposed within associated apertures extending longitudinally through the insulation core 104 and may each be surrounded by the insulation core 104. The sheath 106 may surround the insulation core 104. In some embodiments, one of the wires 102 (e.g., center wire 102c) and the sheath 106 may be coaxial. In other words, the center wire 102c and the sheath 106 may share a center longitudinal axis 108. In such embodiments, other wires 102 may be disposed around the center wire 102c, as depicted in FIG. 1B.

In one or more embodiments, each of the wires 102 and the sheath 106 may be connected via a respective electrical junction 110a, 110b, 110c, 110d, 110e (referred to herein collectively with the reference numeral "110"). For example, one or more of the wires 102 may be in contact with an inner surface of the sheath 106 at various locations along a longitudinal length of the sheath 106. In particular, in one or more embodiments, one or more of the wires 102 may be folded (e.g., bent) back over itself at a longitudinal end thereof to form a folded end 111 (e.g., a hook end), and the folded end 111 of the one or more of the wires 102 may contact the sheath 106. Furthermore, the multi-core thermocouple 100 may be swaged at a mid-section 113 of the sheath 106 (e.g., may include a swaged axial mid-section 113) to press the folded end 111 of the one or more wires 102 to form an electrical junction 110 between the one or more wires 102 and the sheath 106. For instance, an outer diameter of the sheath 106 may be reduced at the axial location of the folded end 111 of the one or more wires 102 until the sheath 106 contacts and/or presses against the wire 102 and the folded end 111 is pressed and at least partially secured between the sheath 106 and the insulation core 104. Any of the wires 102 disposed around the center wire 102c may form an electrical junction 110 with the sheath 106 via a folded end 111 and a swaged mid-section 113. Furthermore, distances between the electrical junctions 110 along a center longitudinal axis 108 of the multi-core thermocouple 100 may be selected to accommodate a given application. For instance, an axial location (e.g., position) of a first folded end 111 of a first wire 102 (and as a result, a first electrical junction 110) along the center longitudinal axis 108 of the multi-core thermocouple 100 may be different than an axial location of a second folded end 111 of a second wire 102 along the center longitudinal axis 108 of the multi-core thermocouple 100. The electrical junctions 110 formed at swaged mid-sections 113 of the multi-core thermocouple 100 may also be referred to herein as mid electrical junctions 110. The electrical junctions 110 between the wires and the sheath 106 are described in greater detail below in regard to FIGS. 2 and 3.

Figure 3:
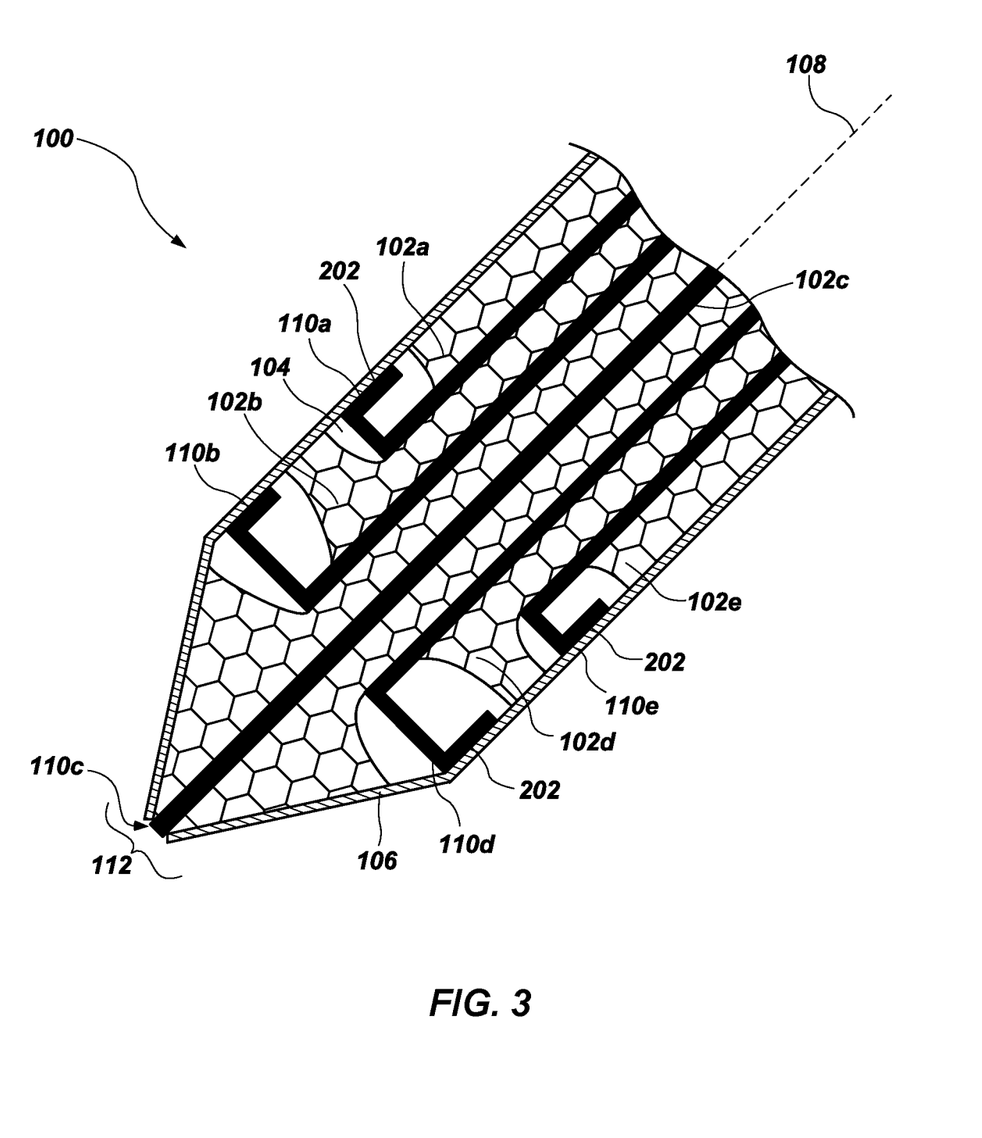
FIG. 3 shows another schematic side internal view of a multi-core thermocouple according to one or more embodiments of the present disclosure.

Additionally, in some embodiments, the multi-core thermocouple 100 may include a swaged end 112 (e.g., a swaged longitudinal end) forming another thermocouple. At the swaged end 122, an outer diameter of the sheath 106 may be reduced along the center longitudinal axis 108 of the multi-core thermocouple 100 until the sheath 106 contacts a center wire 102 (e.g., center wire 102c). In some embodiments, the swaged end 112 may include the sheath 106 being swaged onto and over the center wire 102c to form a point and at least substantially fully covering the center wire 102. In other embodiments, the center wire 102 (e.g., center wire 102c) may be partially exposed (FIG. 3). For instance, the swaged end 112 of the multi-core thermocouple 100 may include a frustum (e.g., a frustoconical shape) such that the center wire 102 of the multi-core thermocouple 100 is exposed and the sheath 106 is swaged onto the center wire 102 to form an electrical junction 110. In some embodiments, the multi-core thermocouple 100 may not include the center wire 102 (e.g., center wire 102c). In other words, a center wire 102 is not required in every embodiment described herein.

In one or more embodiments, the multi-core thermocouple 100 may include a center wire 102 and at least four wires 102 disposed around the center wire 102 and radially spaced from the center wire 102. In some embodiments, the multi-core thermocouple 100 may include at least five wires, at least seven wires, at least nine wires, at least fifteen wires, or at least twenty-one wires. For example, a number of wires 102 within the multi-core thermocouple 100 may be increased as a diameter and cross-sectional area of the multi-core thermocouple 100. In one or more embodiments, the multi-core thermocouple 100 may include at least twenty one wires per 31.7 mm$^2$ of cross-sectional area of the multi-core thermocouple 100.

In one or more embodiments, each wire of the plurality of wires 102 may form a first element of a thermocouple of the multi-core thermocouple 100, and the sheath 106 may form a second element of the respective thermocouple of the multi-core thermocouple 100. Furthermore, the sheath 106 may be a common element of each of the thermocouples of the multi-core thermocouple 100. Additionally, each of the wires 102 may include an electrical conductor dissimilar from an electrical conductor of the sheath 106. As a result, the dissimilar materials of the first element and second elements (i.e., the wire 102 and the sheath 106) of each of the respective thermocouples may form differing temperatures at each the electrical junctions 110 (e.g., the swaged mid-sections 113 and the swaged end 112). Due to the differing temperatures of the dissimilar materials at the electrical junctions 110, each of the thermocouples of the multi-core thermocouple 100 may produce a temperature dependent voltage as a result of the thermoelectric effect, and as is known in the art, the produced voltage may be interpreted to measure a temperature.

In some embodiments, one or more of the wires 102 may include molybdenum (Mo) and at least a portion of the sheath 106 may include niobium (Nb). In other embodiments, one or more of the wires 102 may include niobium (Nb) and at least a portion the sheath 106 may include molybdenum (Mo). In some instances, the niobium (Nb) and/or the molybdenum (Mo) may be at least substantially pure (i.e., 100%) niobium (Nb) and/or molybdenum (Mo) within the restraints of material purification processes. In some embodiments, either one or more of the wires 102 or the sheath 106 may include a molybdenum-niobium alloy. For instance, either one or more of the wires 102 or the sheath 106 may include a molybdenum-niobium alloy with between about 0% and about 15% niobium (Nb) by mass. For example, the molybdenum-niobium alloy may include about 10% niobium (Nb) by mass. In other embodiments, either one or more of the wires 102 or the sheath 106 may include a niobium-molybdenum alloy. For instance, either one or more of the wires 102 or the sheath 106 may include a niobium-molybdenum alloy with between about 0% and about 15% molybdenum (Mo) by mass. For example, the niobium-molybdenum alloy may include about 10% molybdenum (Mo) by mass.

In some embodiments, one or more of the wires 102 may include a material that is different from a material of one or more of the other wires 102. In particular, the wires 102 may include any of the materials described above and the material of the wires 102 may vary from wire to wire. For instance, in one or more embodiments, one or more of the wires 102 may include a first molybdenum-niobium alloy and another of the wires 102 may include a second, different molybdenum-niobium alloy. Furthermore, the sheath 106 may include multiple portions along a longitudinal length of the sheath 106, and one or more of the portions of the sheath 106 may include a material differing from one or more of the other portions of the sheath 106. For instance, the portions of the sheath 106 may include any of the materials described above, and the material of the portions may vary from portion to portion. In some embodiments, the portions of the sheath 106 may have distinct boundaries. In other embodiments, the sheath 106 may include one or more gradients transitioning from a first portion of the sheath 106 to a second portion of the sheath 106.

Because one or more of the thermocouples of the multi-core thermocouple 100 may include molybdenum (Mo), niobium (Nb), molybdenum-niobium alloys, and/or niobium-molybdenum alloys as a respective wire 102 and/or the sheath 106, the multi-core thermocouple 100 may be advantageous over conventional thermocouples. For example, molybdenum (Mo) and niobium (Nb) and associated alloys exhibit relatively high melting temperatures. As a result of the high melting temperatures of the wire 102 and the sheath 106 of the thermocouples of the multi-core thermocouple 100, the multi-core thermocouple 100 may be utilized in high temperature environments (e.g., nuclear reactors, high temperature drilling operations, aircraft, space craft, etc.).

Furthermore, molybdenum (Mo), niobium (Nb), molybdenum-niobium alloys, and/or niobium-molybdenum alloys exhibit relatively low neutron absorption cross-sections. As a result, the wires 102 and the sheath 106 may exhibit relatively high irradiation resistances in comparison to conventional thermocouples. For example, the effective cross-sectional areas of the atoms within the wires 102 and the sheath 106 that are presented to absorption are relatively small, and the probability that atoms of the wires 102 and the sheath 106 will capture neutrons is relatively low. Due to the low neutron absorption cross-sections of the wires 102 and the sheath 106, the thermocouples of the multi-core thermocouple 100 and the multi-core thermocouple 100 itself of the present disclosure may provide advantages over conventional thermocouples. For example, within radioactive environments, when conventional thermocouples would be rendered inoperable due to neutron absorption and the atoms of the elements of the conventional thermocouples changing isotopes, the thermocouples of the multi-core thermocouple 100 of the present disclosure remain functional and operational. Moreover, because the multi-core thermocouple 100 includes multiple thermocouples, the multi-core thermocouple 100 may enable live measuring of temperature profiles of reactor fuel pins and in pile during reactor operation. As a result, the multi-core thermocouple 100 provides information regarding fuel behavior during irradiation and may reduce a required amount of tests to be performed. The foregoing may significantly reduce costs of performing tests.

Moreover, the molybdenum (Mo), niobium (Nb), molybdenum-niobium alloys, and/or niobium-molybdenum alloys exhibit sufficiently-high ductility to enable relatively fast and effective manufacturing of the multi-core thermocouple 100 of the present disclosure, as is discussed in further detail below.

Referring still to FIGS. 1A and 1B, in one or more embodiments, one or more of the materials forming the wires 102 and/or the sheath 106 may include a dopant. For example, in some embodiments, either one or more of the wires 102 or the sheath 106 may include molybdenum (Mo) doped within Lanthanum (La) oxide. In one or more embodiments, either one or more of the wires 102 or the sheath 106 may include molybdenum (Mo) doped with Lanthanum (La) oxide by an amount within a range of about 0% and about 2% by weight. In some embodiments, either one or more of the wires 102 or the sheath 106 may include molybdenum (Mo) doped with Lanthanum (La) oxide by an amount of about 1% by weight. In additional embodiments, either one or more of the wires 102 or the sheath 106 may include molybdenum (Mo) doped with one or more of potassium (K), silicate $(SiO_4)^{4-}$, tungsten (W), or silicon (Si). In such embodiments, either one or more of the wires 102 or the sheath 106 may include molybdenum (Mo) doped with one or more of potassium (K), silicate $(SiO_4)^{4-}$, tungsten (W), or silicon (Si) by an amount within a range of about 100 ppm and about 300 ppm per dopant. In further embodiments, either one or more of the wires 102 or the sheath 106 may include niobium (Nb) doped with phosphorus (P). For example, either one or more of the wires 102 or the sheath 106 may include niobium (Nb) doped with phosphorus (P) by an amount within a range of 700 μg/g and about 1300 μg/g. In some embodiments, either one or more of the wires 102 or the sheath 106 may include niobium (Nb) doped with phosphorus (P) by an amount of about 1000 μg/g. In yet further embodiments, either one or more of the wires 102 or the sheath 106 may include niobium (Nb) doped with zirconium (Zr). For example, either one or more of the wires 102 or the sheath 106 may include niobium (Nb) doped with zirconium (Zr) by an amount within a range of about 0% to about 2% by weight. In some embodiments, either one or more of the wires 102 or the sheath 106 may include niobium (Nb) doped with zirconium (Zr) by an amount of about 1% by weight.

Furthermore, in some embodiments, one or more of the wires 102 may include a dopant that is different from a dopant of one or more of the other wires 102. In particular, the wires 102 may include any of the dopants described above and the dopants may vary from wire 102 to wire 102. For instance, in one or more embodiments, one or more of the wires 102 may include a first dopant and another of the wires may include a second, different dopant. Furthermore, the sheath 106 may include multiple portions, and one or more of the portions of the sheath 106 may include a dopant differing from one or more of the other portions of the sheath 106. For instance, the portions of the sheath 106 may include any of the dopants described above, and the dopants may vary from portion to portion of the sheath 106. As noted above, in some embodiments, the portions of the sheath 106 may have distinct boundaries. In other embodiments, the sheath 106 may include one or more gradients transitioning from a first dopant of a first portion of the sheath 106 to a second dopant of a second portion of the sheath 106.

Doping the materials of the wire 102 and/or the sheath 106 with the dopants describe herein may reduce a brittleness of the wire 102 and/or the sheath 106. As a result, the dopants may improve a durability of multi-core thermocouple 100 and may increase a lifetime of the multi-core thermocouple 100.

Referring still to FIGS. 1A and 1B together, in some embodiments, one or more of the wires 102 may include one or more of CHROMEL (e.g., about 90% nickel and about 10% chromium). For example, in an embodiment including five wires 102, the multi-core thermocouple 100 may include three wires 102 including molybdenum (Mo) and two wires 102 include CHROMEL In some instances, the two wires 102 including CHROMEL may have electrical junctions 110 with the sheath 106 in regions of the multi-core thermocouple 100 intended to experience lower temperatures than regions of the multi-core thermocouple 100 having the electrical junctions 110 of the three wires 102 including molybdenum (Mo).

Furthermore, in further embodiments, the sheath 106 or one or more portions of the sheath 106 may include platinum and one or more of the wires 102 may include a platinum-rhodium alloy (e.g., about 90% platinum and about 10% rhodium). In other words, one or more of the wires 102 and the sheath 106 may form a Type S thermocouple.

In one or more embodiments, the insulation core 104 may include a ceramic. For example, the insulation core 104 may include one or more of Alumina ($Al_2O_3$), Magnesia (MgO), Hafnia ($HfO_2$), Silica ($SiO_2$), Zirconia ($ZrO_2$), or Yttria ($Y_2O_3$).

Referring still to FIGS. 1A and 1B, the multi-core thermocouple 100 of the present disclosure may be advantageous over conventional thermocouples. For example, due to the swaged mid-sections 113 and resulting electrical junctions 110 of the multi-core thermocouple 100 and the construction of the swaged end 112 and resulting electrical junction 110 of the multi-core thermocouple 100, the multi-core thermocouple 100 may be significantly smaller (e.g., may have a significantly smaller outer diameter) than conventional thermocouples. In particular, forming the multi-core thermocouple 100 as a cable (i.e., the combination of the wires 102, the insulation core 104, and the sheath 106 as a cable) and forming the swaged mid-sections 113 to form electrical junctions 110 and swaged end 112 at an end of the cable further enables smaller diameters of the multi-core thermocouple 100. For example, in some embodiments, the multi-core thermocouple 100 may have an outer diameter (e.g., an outer diameter of the sheath 106) within a range of about 0.1 mm and about 3.175 mm. For instance, the multi-core thermocouple 100 may have an outer diameter of about 0.25 mm. One of ordinary skill in the art will readily recognize that larger applications fall within the scope of the present disclosure as well. For example, in other embodiments, the multi-core thermocouple 100 may have an outer diameter of about 1 mm, 1 cm, 5 cm, 10 cm, or any other desired size.

Additionally, as is known in the art, response times of thermocouples are associated with a size of the elements of the thermocouple, and as a result, the overall outer perimeter (e.g., diameter) of the thermocouple. Furthermore, the relatively fine tip of the swaged end 112 (i.e., electrical junction) of the center wire 102 of the multi-core thermocouple 100 may behave like an exposed junction thermocouple and may assimilate to surrounding temperatures relatively quick, thus enabling even faster response times. Furthermore, because the portions of the wires 102 forming electrical junctions 110 of the other thermocouples of the multi-core thermocouple 100 are pressed against the sheath 106 at the swaged mid-sections 113, the other electrical junctions 110 (i.e., mid electrical junctions 110) may also behave similar to exposed junction thermocouples and may assimilate to surrounding temperatures relatively quick, thus enabling even faster response times. As a result, the multi-core thermocouple 100 of the present disclosure may provide faster response times than conventional thermocouples. For example, in some embodiments, the multi-core thermocouple 100 of the present disclosure may exhibit a response time with a range of one third and about one half of the response time of a conventional thermocouple. For instance, the multi-core thermocouple 100 of the present disclosure may exhibit a response time of less than 0.125 seconds, than 0.08 seconds, less than 0.04 seconds, or less than 0.02 seconds.

Furthermore, the multi-core thermocouple 100 of the present disclosure may be easier to manufacture than conventional thermocouples (e.g., a K-type thermocouple). In particular, due to the construction of the multi-core thermocouple 100 and the materials used as the wire 102, the insulation core 104, and the sheath 106, long lengths (e.g., spools) of cabling (e.g., 35 meters, 50 meters, 100 meters, etc., of cabling) including the wires 102, the insulation core 104, and the sheath 106 may be formed, and subsequently, smaller lengths of cabling may merely be cut (e.g., cut to size) from the long lengths of cabling, and a longitudinal end of a smaller length may be swaged (as described herein) to form the multi-core thermocouple 100. As a result, the multi-core thermocouple 100 of the present disclosure may be easily and quickly formed and may be customizable in length for given applications. In view of the foregoing, multi-core thermocouples 100 of the present disclosure may reduce manufacturing time, may utilize less material, and may reduce costs of manufacturing in comparison to conventional thermocouples.

Figure 2:
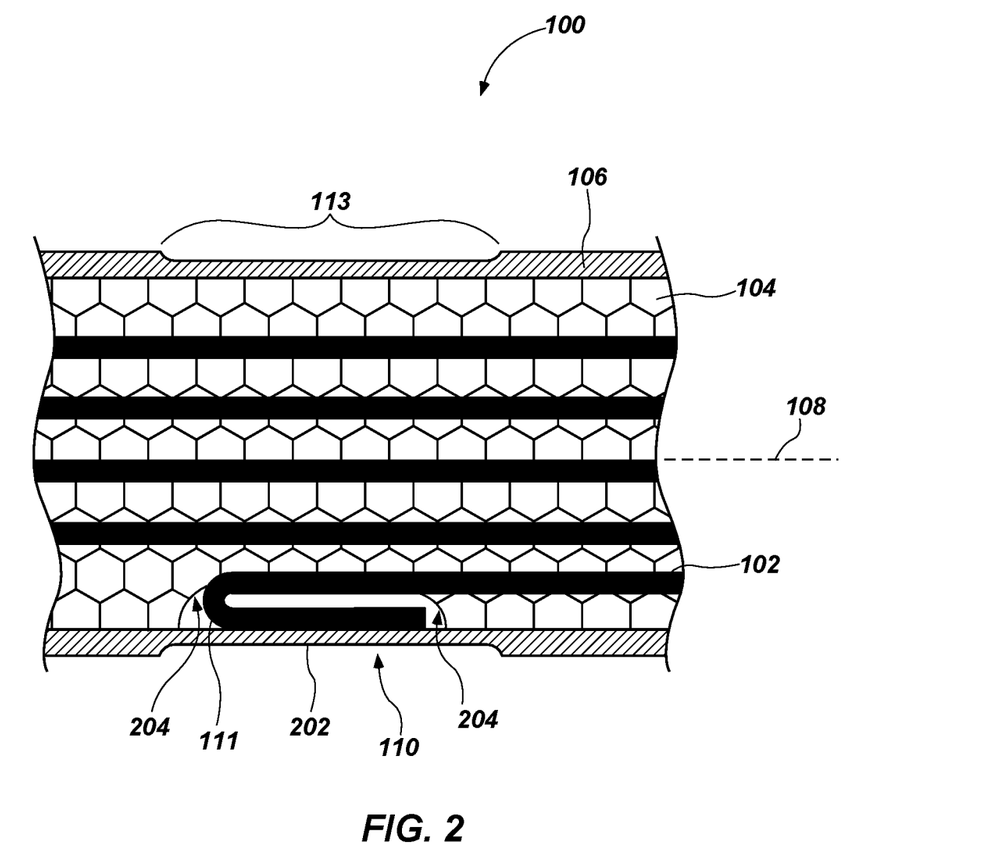
FIG. 2 shows a schematic side internal view of a multi-core thermocouple according to one or more embodiments of the present disclosure.

FIG. 2 is a schematic side internal view of a multi-core thermocouple 100 according to one or more embodiments of the present disclosure. FIG. 3 is another schematic internal view of a multi-core thermocouple 100 according to one or more embodiments of the present disclosure. Although FIGS. 1A, 2, and 3 appear to depict the wires 102 falling within a single plane, the disclosure is not so limited; rather, the depictions in FIGS. 1A, 2, and 3 are for illustration purposes and the wires 102 may be distributed about a center wire 102 and/or a longitudinal axis of the multi-core thermocouple 100, as shown in FIG. 1B. Referring to FIGS. 1A-3 together, each of the electrical junctions 110 (e.g., mid electrical junctions) of the multi-core thermocouple 100 may include a wire 102 that is folded (e.g., bent) back over itself at a longitudinal end thereof to form a folded end 111 (e.g., a hook end). Furthermore, the folded end 111 may include a portion 202 (e.g., a short member of the folded end 111) configured to press against an inner surface of the sheath 106 and form a respective electrical junction 110 with the sheath 106. Additionally, where the wire 102 is folded over itself and where the folded end 111 is formed, the insulation core 104 may include a cavity 204 to at least partially house (e.g., receive) the folded end 111 and to permit the sheath 106 to be swaged without causing a protrusion in the sheath 106. The cavities 204 may extend radially inward into the insulation core 104 from an outer surface of the insulation core 104. A radial depth of the cavities 204 from an exterior surface of the multi-core thermocouple 100 may at least partially depend on a radial depth of an associated wire.

Referring still to FIGS. 1A-3 together, in some embodiments, instead of wires and a cylindrical sheath, the multi-core thermocouple 100 may include a plurality of ribbon elements forming electrical junctions with a common hollow ribbon sheath. Furthermore, in additional embodiments, the multi-core thermocouple 100 may have any cross-sectional shape including a rectangle, a triangle, a hexagon, or an octagon, etc., and the first and second elements may have any cross-sectional shape.

Figure 4:
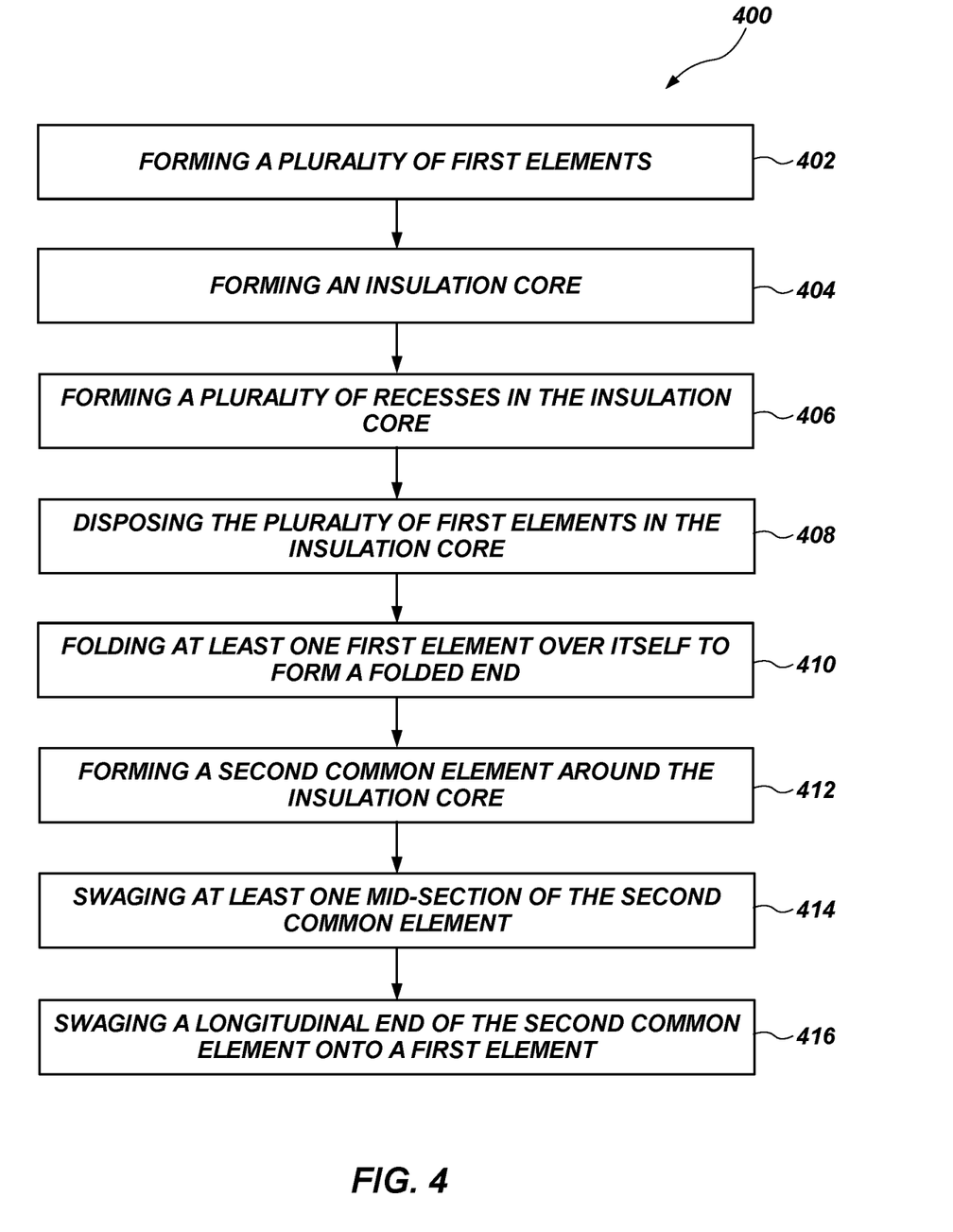
FIG. 4 shows a flow chart of a method of forming a multi-core thermocouple according to one or more embodiments of the present disclosure.

FIG. 4 shows a flow chart of a method 400 of forming a multi-core thermocouple 100 according to one or more embodiments of the present disclosure. In some embodiments, the method 400 may include forming a plurality of first elements of the multi-core thermocouple 100, as shown in act 402 of FIG. 4. Forming the plurality of first elements of the multi-core thermocouple 100 may include forming a plurality of wires 102. For example, forming the plurality of first elements of the multi-core thermocouple 100 may include forming any of the wires 102 described above in regard to FIGS. 1A and 1B. Additionally, forming the plurality of first elements of the multi-core thermocouple 100 may include forming any number of the wires 102 described above (e.g., at least three, at least five, at least seven, at least nine, at least fifteen, at least twenty-one wires). Furthermore, act 402 may include forming the plurality of first elements of one or more materials. For instance, forming the plurality of first elements of the multi-core thermocouple 100 may include forming at least one wire 102 of the plurality of wires 102 to include molybdenum (Mo), niobium (Nb), molybdenum-niobium alloys, and/or niobium-molybdenum alloys. Moreover, forming the plurality of first elements of the multi-core thermocouple 100 may include forming one or more of the plurality of wires 102 to include one or more dopants such as, for example, Lanthanum (La) oxide, potassium (K), silicate $(SiO_4)^{4-}$, tungsten (W), silicon (Si), phosphorus (P), or zirconium (Zr). In some embodiments, forming the plurality of first elements of the multi-core thermocouple 100 may include forming at least one element (e.g., wire) from a first material and at least one element (e.g., wire) from a second different material. In yet further embodiments, forming the plurality of first elements of the multi-core thermocouple 100 may include forming at least one element from CHROMEL and/or forming at least one element from a platinum-rhodium alloy. In one or more embodiments, forming the plurality of first elements may include forming a plurality of wires 102 via any known manner.

The method 400 may further include forming an insulation core 104, as shown in act 404 of FIG. 4. In some embodiments, an insulation core 104 may include forming a cylindrical insulation core 104 from any of the insulation materials described above in regard to FIGS. 1A and 1B. In one or more embodiments, the insulation core 104 may be extruded. Furthermore, in some embodiments, forming an insulation core 104 may include forming a plurality of apertures within the insulation core 104 correlating to the plurality of first elements.

In some embodiments, the method may also include forming a plurality of cavities 204 in the insulation core 104, as shown in act 406 of FIG. 4. In particular, forming a plurality of cavities in the insulation core 104 may include forming a plurality of cavities extending radially inward from an outer peripheral surface, each cavity correlating to a location where a first element of the multi-core thermocouple 100 is intended to form an electrical junction 110 with a second common element (e.g., a sheath described below in regard to act 412 of FIG. 4).

Additionally the method 400 may include disposing the plurality of first elements within the insulation core 104, as shown in act 408 of FIG. 4. For example, disposing the plurality of first elements within the insulation core 104 may include threading the plurality of wires 102 through apertures in the insulation core 104. In one or more embodiments, disposing the plurality of first elements within the insulation core 104 may occur simultaneously with forming the insulation core 104. For instance, in one or more embodiments, the insulation core 104 may be extruded over the plurality of first elements.

Furthermore, the method 400 may include folding a longitudinal end of at least one first element of the plurality of first elements over itself to form a folded end 111, as shown in act 410 of FIG. 2. In some embodiments, folding a longitudinal end of at least one first element of the plurality of first elements over itself to form a folded end 111 includes folding the at least one first element such that the formed folded end 111 is received and/or disposed within a respective cavity 204 of the plurality of cavities 204 in the insulation core 104. In some embodiments, a length of an amount the first element folded over itself may fall within a range of about one diameter of the first element and about three diameters of the first element.

The method 400 may further include forming a second common element of the thermocouples of the multi-core thermocouple 100 around an insulation core 104, as shown in act 412 of FIG. 4. In one or more embodiments, forming the second common element of the thermocouples of the multi-core thermocouple 100 may include forming and/or disposing a sheath 106 around a cylindrical insulation core 104. For example, forming the second common element of the thermocouples of the multi-core thermocouple 100 may include forming the second common element to include any of the sheaths described above in regard to FIGS. 1A-3. Furthermore, act 412 may include forming the second common element of a second material, dissimilar to a material or materials of the plurality of first elements (e.g., the wires 102). For instance, forming the second common element of the multi-core thermocouple 100 may include forming the sheath 106 to include molybdenum (Mo), niobium (Nb), molybdenum-niobium alloys, and/or niobium-molybdenum alloys. Additionally, forming the second common element of the multi-core thermocouple 100 may include forming the sheath 106 to include platinum. Moreover, forming the second common element of the multi-core thermocouple 100 may include forming the sheath 106 to include one or more dopants such as, for example, Lanthanum (La) oxide, potassium (K), silicate $(SiO_4)^{4+}$, tungsten (W), silicon (Si), phosphorus (P), or zirconium (Zr). In one or more embodiments, forming the second common element may include forming a sheath 106 and surrounding the insulation core 104 with the sheath 106 via any known manner. For instance, forming the second common element may include forming cabling via known methods.

In some embodiments, acts 402-412 may include forming cabling to have an outer diameter (e.g., an outer diameter of the sheath 106) within a range of about 0.1 mm and about 10.0 mm. For instance, the multi-core thermocouple 100 may have an outer diameter of about 0.25 mm.

In one or more embodiments, the method 400 may include swaging at least one mid-section 113 of the second common element (i.e., the sheath 106) of the multi-core thermocouple 100 onto a folded end 111 of a first element (e.g., a wire 102) of the plurality of first elements, as shown in act 414 of FIG. 4. Swaging a mid-section 113 of the second element (i.e., the sheath 106) of the multi-core thermocouple 100 onto a folded end 111 of a first element (e.g., a wire 102) of the plurality of first elements may include forming an electrical junction 110 between the first element (e.g., a wire 102) of the plurality of first elements and the second common element (i.e., the sheath 106). In some embodiments, act 414 may include swaging a plurality of mid-sections 113 of the multi-core thermocouple 100 (e.g., swaging a mid-section of the multi-core thermocouple 100 for each first element configured to form an electrical junction 110 with the second common element).

In some embodiments, swaging a mid-section 113 of the multi-core thermocouple 100 may include pressing the mid-section 113 of the multi-core thermocouple 100 into one or more dies (e.g., a series of dies, one or more swages). In some embodiments, swaging the mid-section 113 of the multi-core thermocouple 100 may include reducing an outer diameter of the second element (e.g., the sheath 106) until the second element contacts and presses against the associated first element (e.g., the wire 102). In other words, swaging the mid-section 113 of the multi-core thermocouple 100 may include swaging the sheath 106 onto and against the correlating wire 102 (e.g., a wire correlating to the waged mid-section 113) of the multi-core thermocouple 100. In one or more embodiments, act 414 may include a cold working process. In other embodiments, act 414 may include a hot working process.

Furthermore, in some embodiments, the method 400 may include drawing the mid-section 113 of the multi-core thermocouple 100 to reduce an outer diameter of the second element instead of or in addition to swaging the mid-section of 113 of the multi-core thermocouple 100. Moreover, for the purposes of the present disclosure, any acts of swaging of the multi-core thermocouple 100 described herein may also be achieved by drawing the multi-core thermocouple 100 instead of or in addition to swaging the multi-core thermocouple 100. Additionally, for the purposes of the present disclosure, any mentions of swaged portions of the multi-core thermocouple 100 may refer to drawn portions of the multi-core thermocouple 100.

Furthermore, the method 400 may include swaging a longitudinal end of the second common element of the multi-core thermocouple 100 onto a first element (e.g., a center wire 102c) of the plurality of first elements, as shown in act 416 of FIG. 4. For example, act 416 may include swaging a longitudinal end of multi-core thermocouple 100. In some embodiments, swaging the longitudinal end of the multi-core thermocouple 100 may include pressing the longitudinal end of the multi-core thermocouple 100 into one or more dies (e.g., a series of dies, one or more swages). In some embodiments, swaging the longitudinal end of the multi-core thermocouple 100 may include reducing an outer diameter of the second common element (e.g., the sheath 106) until the second common element contacts the center first element (e.g., a center wire 102). In other words, swaging the longitudinal end of the multi-core thermocouple 100 may include swaging the sheath 106 onto a center wire 102c of the multi-core thermocouple 100. In some embodiments, the swaging the longitudinal end of the multi-core thermocouple 100 may include swaging the sheath 106 onto the wire 102 of the multi-core thermocouple 100 to form a point (as shown in FIG. 1A), and in other embodiments, the swaging the longitudinal end of the multi-core thermocouple 100 may include swaging the sheath 106 onto the wire 102 of the multi-core thermocouple 100 to form a frustum (e.g., a frustoconical shape) (as shown in FIG. 3). In one or more embodiments, act 416 may include a cold working process. In other embodiments, act 416 may include a hot working process. In some embodiments, act 416 may be optional and is not required in every method described herein.

As noted above, the swaged mid-sections 113 and the swaged end 112 of the multi-core thermocouple 100 of the present disclosure provides advantages over conventional thermocouples. For example, the swaged mid-sections 113 (mid electrical junctions 110) and the relatively fine tip of the swaged end 112 (i.e., electrical junction 110) of the multi-core thermocouple 100 may behave like an exposed junction thermocouple and may assimilate to surrounding temperatures relatively quick, thus enabling even faster response times. As a result, the multi-core thermocouple 100 of the present disclosure may provide faster response times in comparison to conventional thermocouples.

Figure 5:
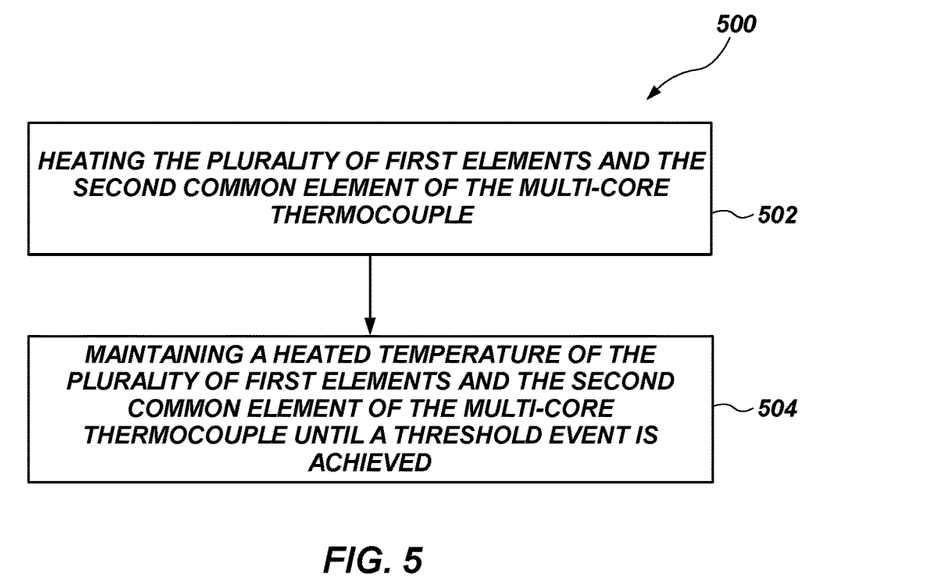
FIG. 5 shows a flow chart of a method of heat treating elements of a multi-core thermocouple according to one or more embodiments of the present disclosure.

FIG. 5 shows a flow chart of a method 300 of heat treating a thermocouple according to one or more embodiments of the present disclosure. In one or more embodiments, the method 500 may include heating a plurality of first elements (e.g., wires 102) and a second common element (e.g., a sheath 106) of the multi-core thermocouple 100 to a threshold temperature, as shown in act 502 of FIG. 5. In some embodiments, the threshold temperature may be at least 1400° C. In additional embodiments, the threshold temperature may be at least 1500° C., 1600° C., or 1700° C. In further embodiments, the threshold temperature may be an anticipated operating temperature of the multi-core thermocouple 100 (e.g., a temperature to which the multi-core thermocouple 100 is expected to be subjected during use).

The method 500 may further include maintaining the heated temperature of the plurality of first elements (e.g., wires 102) and the second common element (e.g., a sheath 106) of the multi-core thermocouple 100 until a threshold event is achieved, as shown in act 504 of FIG. 3. In some embodiments, the threshold event may include at least one hour, two hours, five hours, six hours, seven hours, eight hours, or any other amount of time elapsing while maintaining the heated temperature. In other embodiments, the threshold event may include thermocouples of the multi-core thermocouple 100 exhibiting a fitted electromotive force (EMF) curve of the thermocouples of the multi-core thermocouple 100 that reaches a d(Voltage)/d(time[hr]) of less than 0.001 at operating temperatures (e.g., 1400° C.) of the thermocouples of the multi-core thermocouple 100. In additional embodiments, the threshold event may include the thermocouples of the multi-core thermocouple 100 exhibiting a EMF curve of the thermocouples of the multi-core thermocouple 100 that reaches a d(Voltage)/d(time[hr]) of less than 0.002. The EMF curve is described in further detail below in regard to FIG. 8.

In one or more embodiments, achieving the threshold event may include changing a grain structure of the plurality of first elements (e.g., the wires 102) and a grain structure of the second common element (e.g., the sheath 106) to second grain structures, which cause the thermocouples of the multi-core thermocouple 100 to exhibit the above-described EMF curve. For example, in some embodiments, achieving the threshold event may include stabilizing grain structures of the plurality of first elements and second common element.

Referring still to FIG. 5, in some embodiments, the plurality of first elements (e.g., the wires 102) and the second common element (e.g., the sheath 106) may be heat treated together (e.g., at the same time). In other embodiments, the plurality of first elements (e.g., the wires 102) and the second element (e.g., the sheath 106) may be heat treated separately. In one or more embodiments, when the multi-core thermocouple 100 is formed as cabling, the cabling may be heat treated in portions, and the plurality of first elements (e.g., the wires 102) and the second element (e.g., the sheath 106) of the portions of the cabling may be heat treated at a sufficient enough length that the anticipated operating temperature gradient zone is within the heat treated state of the wires 102 and sheath 106.

Figure 6:
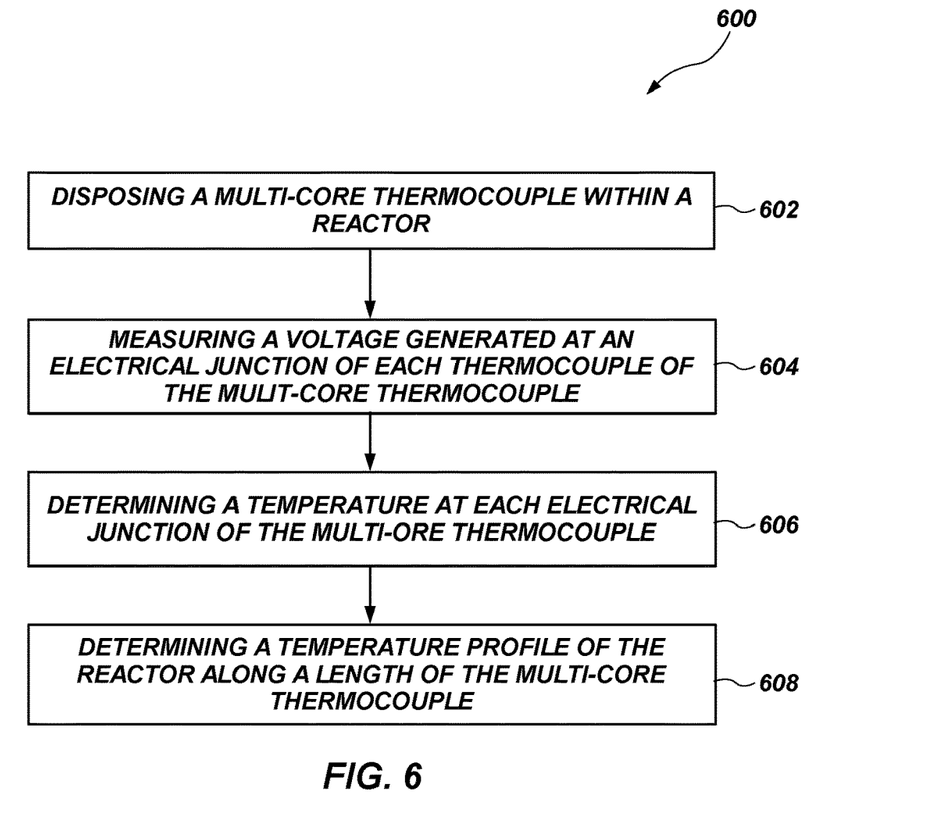
FIG. 6 shows a flow chart of a method of measuring a temperature profile using a multi-core thermocouple according to one or more embodiments of the present disclosure.

FIG. 6 shows a flow chart of a method 600 of measuring a temperature profile within a nuclear reactor utilizing a multi-core thermocouple 100 of the present disclosure. In some embodiments, the method 600 includes disposing a multi-core thermocouple 100 within a nuclear reactor, as shown in act 602 of FIG. 6. For example, act 602 may include disposing the multi-core thermocouple 100 within a reactor vessel, a reactor coolant system, or any other portion of a nuclear reactor system. In some embodiments, the nuclear reactor system may include a conventional pressurized water reactor (PWR), a Magnox, an advanced gas-cooled, a boiling water reactor, a Canada Deuterium Uranium, or a graphite-moderated (e.g., RBMK) reactor system.

The multi-core thermocouple 100 may include any of the multi-core thermocouples 100 described herein. For example, the multi-core thermocouple 100 may include a plurality of wires 102, an insulation core 104, and a sheath 106. Furthermore, the multi-core thermocouple 100 may include any of the swaged mid-sections 113 and swaged ends 112 described herein. Moreover, the plurality of wires 102, the insulation core 104, and the sheath 106 may include any of the materials described above in regard to FIGS. 1A-4.

Upon disposing the multi-core thermocouple 100 within the nuclear reactor, the method 600 may include measuring a voltage generated at each electrical junction 110 of each thermocouple of the multi-core thermocouple 100, as shown in act 604 of FIG. 6. For example, act 604 may include measuring the generated voltages via any conventional method.

Furthermore, the method 600 may include determining a temperature at each electrical junction 110 of the multi-core thermocouple 100 based on the measured voltages, as shown in act 606 of FIG. 6. For instance, act 606 may include determining temperatures based on the measured voltage via any conventional manner.

Moreover, the method 600 may include determining, based on the determined temperatures, a temperature profile of the nuclear reactor along a length of the multi-core thermocouple 100. For instance, the method 600 may include determining a temperature profile such as the temperature profile depicted in FIG. 7.

Figure 7:
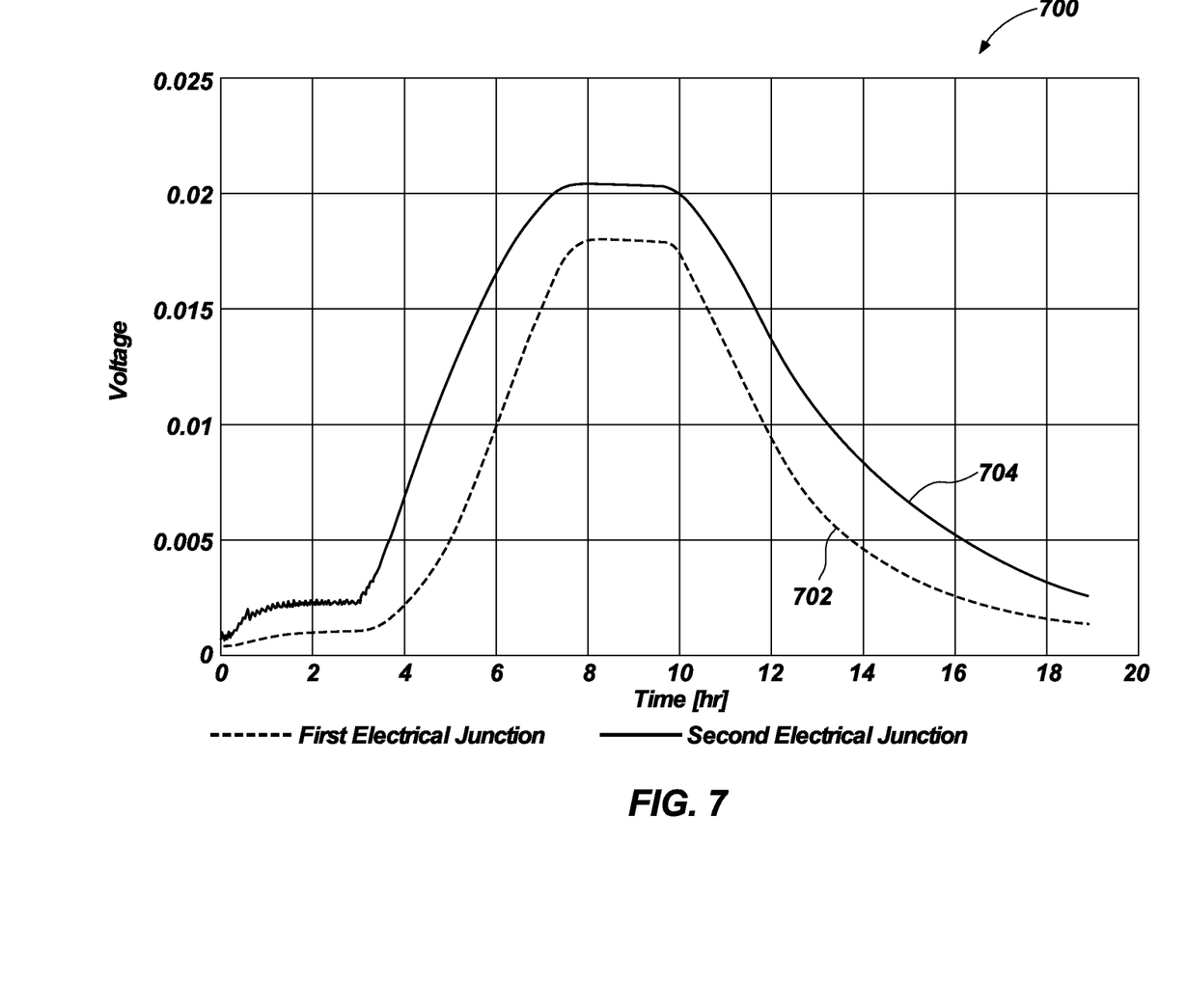
FIG. 7 shows a graph of measured temperatures over time via a multi-core thermocouple according to one or more embodiments of the present disclosure.

FIG. 7 depicts a graph 700 showing voltages measured via a multi-core thermocouple (e.g., multi-core thermocouple 100). In particular, the graph 700 shows a first voltage 702 measured at an electrical junction at the tip of the multi-core thermocouple and a second voltage 704 measured at an electrical junction at a mid-section of the multi-core thermocouple. Furthermore, the graph 700 shows the measured voltages over a twenty-hour period.

Figure 8:
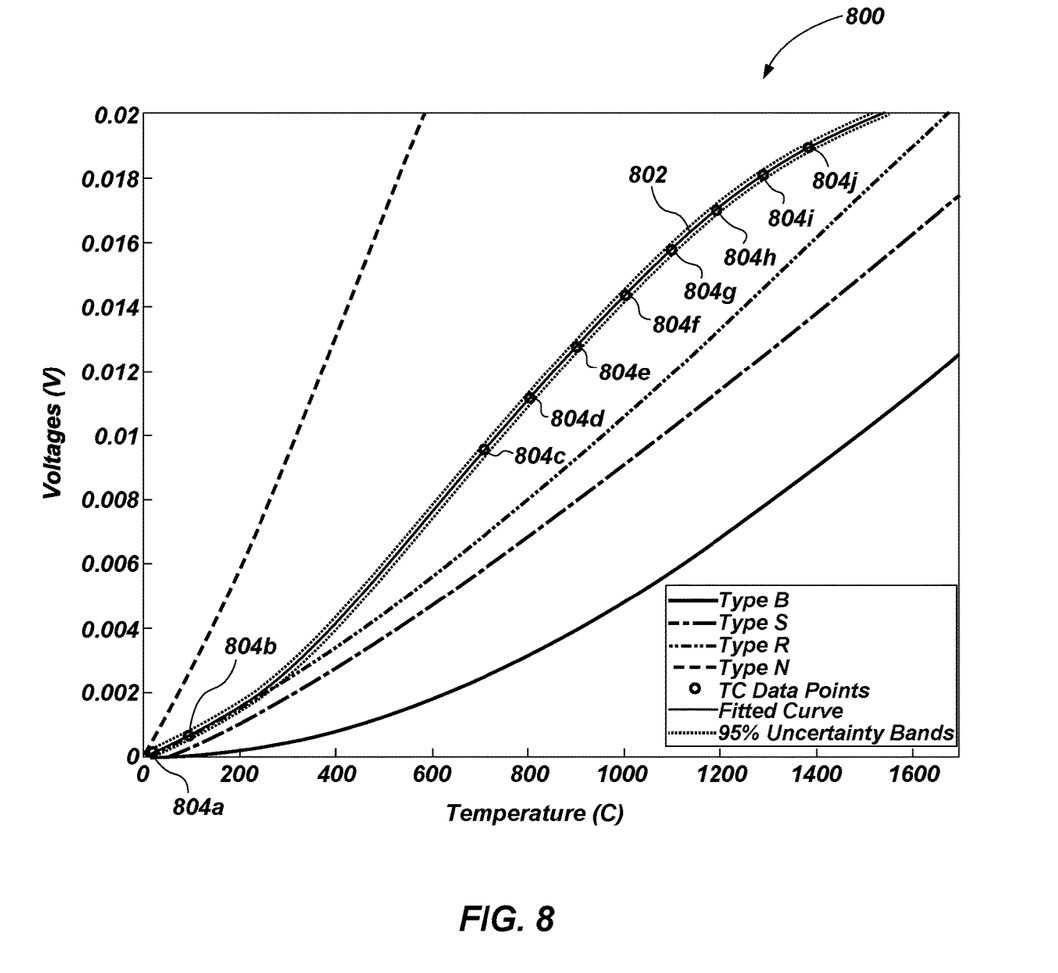
FIG. 8 shows a graph of an electromotive force curve exhibited by coaxial thermocouples of the present disclosure.

FIG. 8 shows a graph 800 having an EMF curve 802 exhibiting properties of thermocouples of the multi-core thermocouple of the present disclosure in comparison to other conventional types of thermocouples. As shown in the graph 800, a fifth order polynomial curve is fitted to measured data points 804a-804j of a thermocouple of the multi-core thermocouple of the present disclosure. Furthermore, in the example depicted in FIG. 8, the fifth order polynomial curve exhibits a leveling off achieving a d(Voltage)/d(time[hr]) within a range of less than 0.001 and less than 0.002 at above about 1400° C.

While a fifth order polynomial curve is depicted in FIG. 8, other polynomials may be fitted to the measured data points, and in some embodiments, a reference table and interpolated values can also be utilized in analyzing measured data points.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. A multi-core thermocouple, comprising:
   a plurality of wires;

an insulation core surrounding the plurality of wires;
a sheath surrounding the insulation core; and
a plurality of electrical junctions comprising:
- a first electrical junction formed between a first wire of the plurality of wires and the sheath at a first axial mid-section of the multi-core thermocouple, the first electrical junction comprising a first swaged axial mid-section of the sheath; and
- a second electrical junction formed between a second wire of the plurality of wires and the sheath at a second, different axial mid-section of the multi-core thermocouple, the second electrical junction comprising a second swaged axial mid-section of the sheath.

2. The multi-core thermocouple of claim 1, wherein the plurality of electrical junctions further comprises a third electrical junction formed between a third wire of the plurality of wires and the sheath and at one longitudinal end of the multi-core thermocouple, the third electrical junction comprising a swaged end with an outer diameter of the sheath reducing in diameter along a longitudinal length of the multi-core thermocouple until the sheath contacts the third wire within the insulation core.

3. The multi-core thermocouple of claim 1, wherein at least one wire of plurality of wires comprises one of molybdenum (Mo) or niobium (Nb), and wherein the sheath comprises the other of molybdenum (Mo) or niobium (Nb).

4. The multi-core thermocouple of claim 1, wherein at least one wire of plurality of wires comprises a platinum-rhodium alloy, and wherein at least a portion of the sheath comprises platinum.

5. The multi-core thermocouple of claim 1, wherein the plurality of wires of the multi-core thermocouple comprises at least twenty-one wires.

6. The multi-core thermocouple of claim 1, wherein each wire of the plurality of wires and the sheath are doped with a dopant reducing a brittleness of the wire and the sheath.

7. A multi-core thermocouple, comprising:
a first wire comprising a first material;
a second wire comprising the first material;
an insulation core surrounding both the first wire and the second wire;
a sheath surrounding the insulation core, the sheath comprising at least a second material;
a first electrical junction formed between the first wire and the sheath at a first axial position along a longitudinal axis of the sheath; and
a second electrical junction formed between the second wire and the sheath at a second, different axial position along the longitudinal axis of the sheath,
wherein the first material comprises one of molybdenum (Mo) or niobium (Nb) and the second material comprises the other of molybdenum (Mo) or niobium (Nb).

8. The multi-core thermocouple of claim 7, wherein the first and second wires comprise molybdenum (Mo) and the sheath comprises niobium (Nb).

9. The multi-core thermocouple of claim 7, wherein the first electrical junction comprises a swaged longitudinal end of the multi-core thermocouple with an outer diameter of the sheath reducing in diameter along the longitudinal axis of the multi-core thermocouple until the sheath contacts the first wire within the insulation core.

10. The multi-core thermocouple of claim 7, wherein the second electrical junction comprises a swaged axial mid-section of the sheath.

11. The multi-core thermocouple of claim 10, wherein the second electrical junction further comprises a folded end of the second wire pressed against an inner surface of the sheath.

12. The multi-core thermocouple of claim 11, wherein the second electrical junction further comprises a cavity formed in the insulation core and extending radially inward from an outer surface of the insulation core, and wherein the folded end of the second wire is disposed within the cavity.

13. The multi-core thermocouple of claim 7, wherein the multi-core thermocouple comprises at least twenty-one wires per 31.7 mm$^2$ of cross-sectional area of the multi-core thermocouple.

14. The multi-core thermocouple of claim 7, wherein the first and second wires comprise molybdenum (Mo) doped with Lanthanum (La) oxide by an amount within a range of about 0% and about 2% by weight.

15. The multi-core thermocouple of claim 7, wherein the first and second wires comprise molybdenum (Mo) doped with one or more of potassium (K), silicate $(SiO_4)^{4-}$, tungsten (W), or silicon (Si) by an amount within a range of about 100 ppm and about 300 ppm per dopant.

16. The multi-core thermocouple of claim 7, further comprising:
a third wire comprising a third material different from the first material; and
a third electrical junction formed between the third wire and the sheath at a third axial position along the longitudinal axis of the sheath.

17. The multi-core thermocouple of claim 16, wherein the third wire comprise a platinum-rhodium alloy.

18. The multi-core thermocouple of claim 17, wherein at least a portion of the sheath comprises platinum.

19. A method of forming a multi-core thermocouple, comprising:
forming a plurality of wires;
forming an insulation core;
disposing the plurality of wires within the insulation core;
folding a longitudinal end of at least one wire of the plurality of wires back upon itself to form a folded end;
forming a sheath surrounding the insulation core;
forming a first electrical junction between a first wire of the plurality of wires and the sheath, at a first axial mid-section of the multi-core thermocouple, by swaging the first axial mid-section of the sheath; and
forming a second electrical junction between a second wire of the plurality of wires and the sheath, at a second, different axial mid-section of the multi-core thermocouple, by swaging the second, different axial mid-section of the sheath.

20. The method of claim 19, wherein forming the first electrical junction between the first wire of the plurality of wires and the sheath comprises swaging a mid-section of the sheath to contact a folded end of a first wire of the plurality of wires.

* * * * *